United States Patent [19]

Hennessy et al.

[11] Patent Number: 5,448,095

[45] Date of Patent: Sep. 5, 1995

[54] SEMICONDUCTORS WITH PROTECTIVE LAYERS

[75] Inventors: James M. Hennessy, Conesus; Jack E. Taylor, Rochester, both of N.Y.

[73] Assignee: Eastman Kodak Company, Rochester, N.Y.

[21] Appl. No.: 170,486

[22] Filed: Dec. 20, 1993

[51] Int. Cl.6 ............................................. H01L 29/06
[52] U.S. Cl. .................................. 257/355; 257/642; 257/659
[58] Field of Search ............... 257/355, 356, 508, 642, 257/643, 659

[56] References Cited

U.S. PATENT DOCUMENTS

| 3,356,858 | 12/1967 | Wanlass | 257/369 |
| 3,887,993 | 6/1975 | Okada et al. | 257/369 |
| 4,169,270 | 9/1979 | Hayes | 257/387 |
| 4,328,262 | 5/1982 | Kurahashi et al. | 257/643 |
| 4,785,338 | 11/1988 | Kinoshita et al. | 257/435 |
| 4,835,592 | 5/1989 | Zommer | 257/620 |
| 5,047,711 | 9/1991 | Smith et al. | 257/620 |

FOREIGN PATENT DOCUMENTS 60-261169 12/1985 Japan ..................... 257/659

OTHER PUBLICATIONS

S. Picard, "Field-Effect Transistor Protection Method", *IBM Technical Disclosure Bulletin*, vol. 15 (Jun. 1972) p. 245.

S. M. Sze, *Semiconductor Device Physics and Technology*, John Wiley & Sons, New York (1985) p. 344.

*Primary Examiner*—J. Carroll
*Attorney, Agent, or Firm*—James D. Leimbach

[57] ABSTRACT

A combination of layers protects a semiconductor device from electrostatic discharge during dicing. A polymer layer coats the device, wherein the polymer layer has an aluminum layer on its outer surface and wherein the aluminum layer electrically connects the wire bonding pads of the device.

9 Claims, 3 Drawing Sheets

SEMICONDUCTORS WITH PROTECTIVE LAYERS

TECHNICAL FIELD

This invention relates to semiconductor devices with temporary protective layers. The layers protect the device from electrostatic discharge (ESD).

BACKGROUND ART

Semiconductor devices are fabricated in wafer form and tested electrically before packaging begins. Some semiconductor devices, such as certain imagers, are very sensitive to ESD, having gate oxides as thin as 400 angstroms (Å) with capacitances of the order of femtofarads (fF). The breakdown voltage of these gates can be as low as 50 to 75 volts, and will be proportionately lower for thinner gate dielectrics. The devices become particularly sensitive to small electrostatic charges during and after wafer dicing. These factors often result in significant yield losses in spite of precautionary measures utilized in manufacturing processes and areas.

An effective method of ESD protection is utilized beginning with wire bonding when all external package pins, which are electrically connected, are connected via the wires to the bond pads. This eliminates most of the danger of ESD related failures during the remainder of the packaging process by avoiding the possibility of voltage gradients within the semiconductor device. However, as each wire is being connected during wire bonding, voltage gradients external to the semiconductor or within the semiconductor structures can be transmitted via the wire to sensitive gates, causing damage. Of course, this method does not protect the devices prior to wire bonding; during dicing, second optical inspection, and die bonding.

Imager devices are also sensitive to dirt and debris. To protect our images during dicing, an intrinsically dirty operation, we use a polymeric layer, called a dicing protection layer (DPL) which is applied following the wafer electrical test. After dicing, the imager chip is bonded into a package, and the bonding epoxy is cured. Following curing, the DPL is removed, along with the dirt and debris, using a solvent cleaning system.

Disclosure of Invention

For those circumstances where conventional on chip ESD protective structures (diodes) are not desirable due to performance considerations, such as imagers, ESD protection is possible by using a patternable DPL (PDPL), with a conductive layer applied over the PDPL, or a conductive PDPL (CPDPL).
PDPL The PDPL applied to the wafer is exposed and etched to remove the PDPL covering the wire bond pads. A thin (150–250 Å) aluminum (or other conductive metal compatible with this purpose) layer is applied over the PDPL. This layer electrically connects the bond pads, hence sensitive device structures, preventing ESD damage. During wire bonding, the aluminum layer which is on the bond pads becomes a part of the metallic bond. Following wire bond, the devices are washed in the solvent cleaning system. As solvent penetrates through the thin aluminum, the PDPL is dissolved and washed away along with the aluminum.
CPDPL In this preferred embodiment, the polymeric layer is made conductive through a chemical change or addition of a conductive material. The CPDPL is patterned to expose the bond pads, with exception of the periphery of the pads, where the CPDPL contacts the pads. Hence, the conductive nature of the CPDPL provides the electrical connection of the device pads, providing the ESD protection. Again, following wire bond, the CPDPL is washed off in the cleaning system.

DESCRIPTION OF THE PREFERRED EMBODIMENTS

Figure 1:
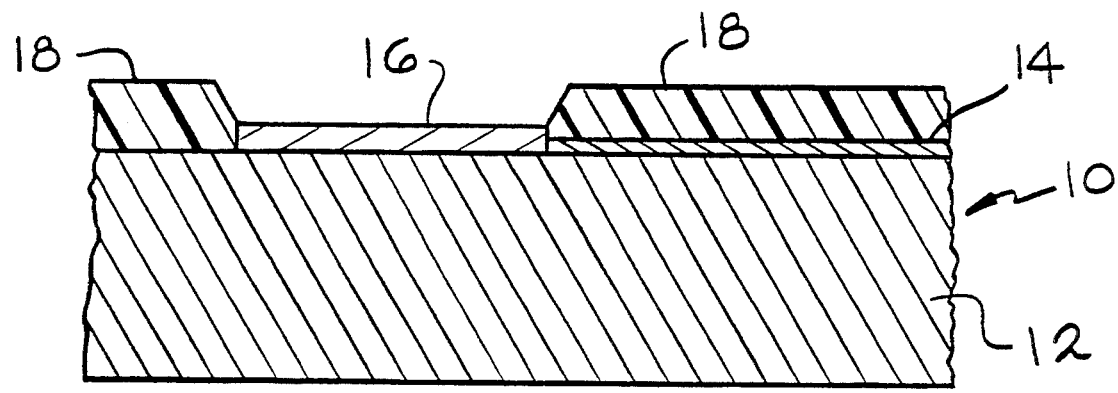
FIG. 1 is PDPL applied to a wafer where the PDPL is exposed, etched and removed from the wire bond pads.

FIG. 1 is a schematic view showing a portion of semiconductor wafer 10. Wafer 10 comprises semiconductor device 12 with device structure 14 thereon. Wire bond pad 16 is disposed on device 12. PDPL 18 covers the upper surface of wafer 10 with PDPL 18 removed from bond pad 16.

Figure 2:
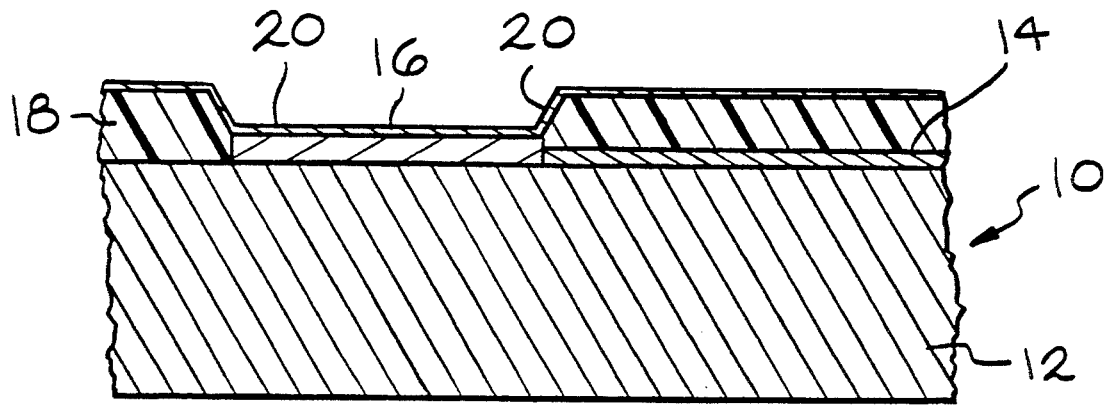
FIG. 2 shows a thin aluminum layer covering the PDPL

FIG. 2 shows thin aluminum layer 20 applied over PDPL 18 and bond pad 16. Aluminum layer 20 electrically connects bond pad 16 to other bond pads in the final semiconductor (not shown).

Figure 3:
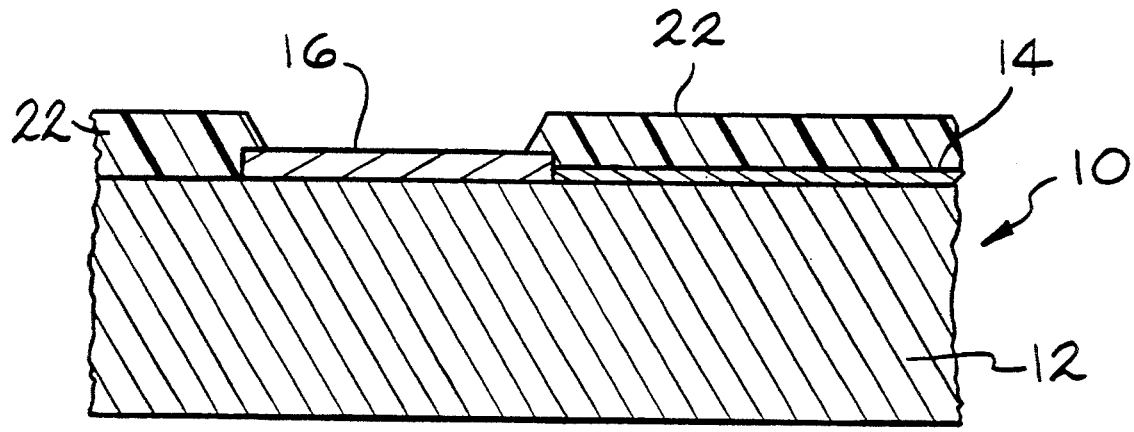
FIG. 3 shows CPDPL covering the wafer except for a portion of the wire bond pads.
Figure 4:
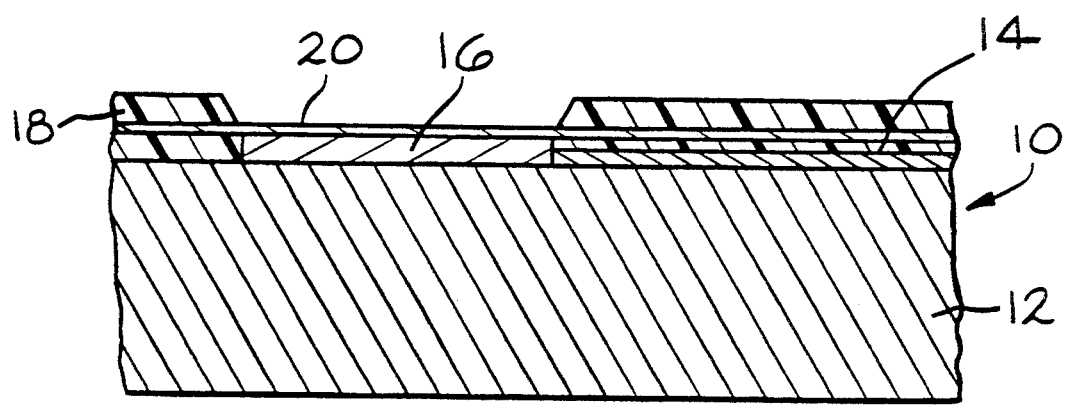
FIG. 4 shows the aluminum layerembedded in the polymer layer.
Figure 5:
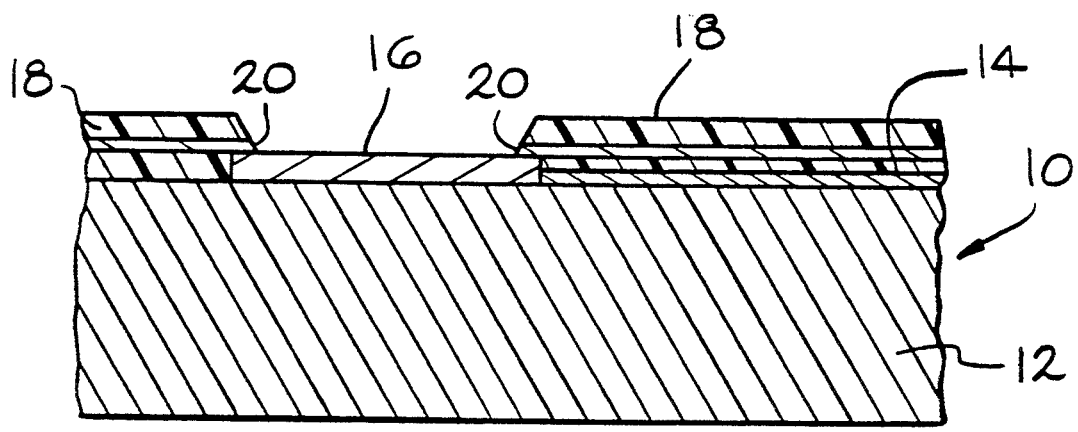
FIG. 5 shows the aluminum layer embedded polymer covering only the periphery of the bond pads.
Figure 6:
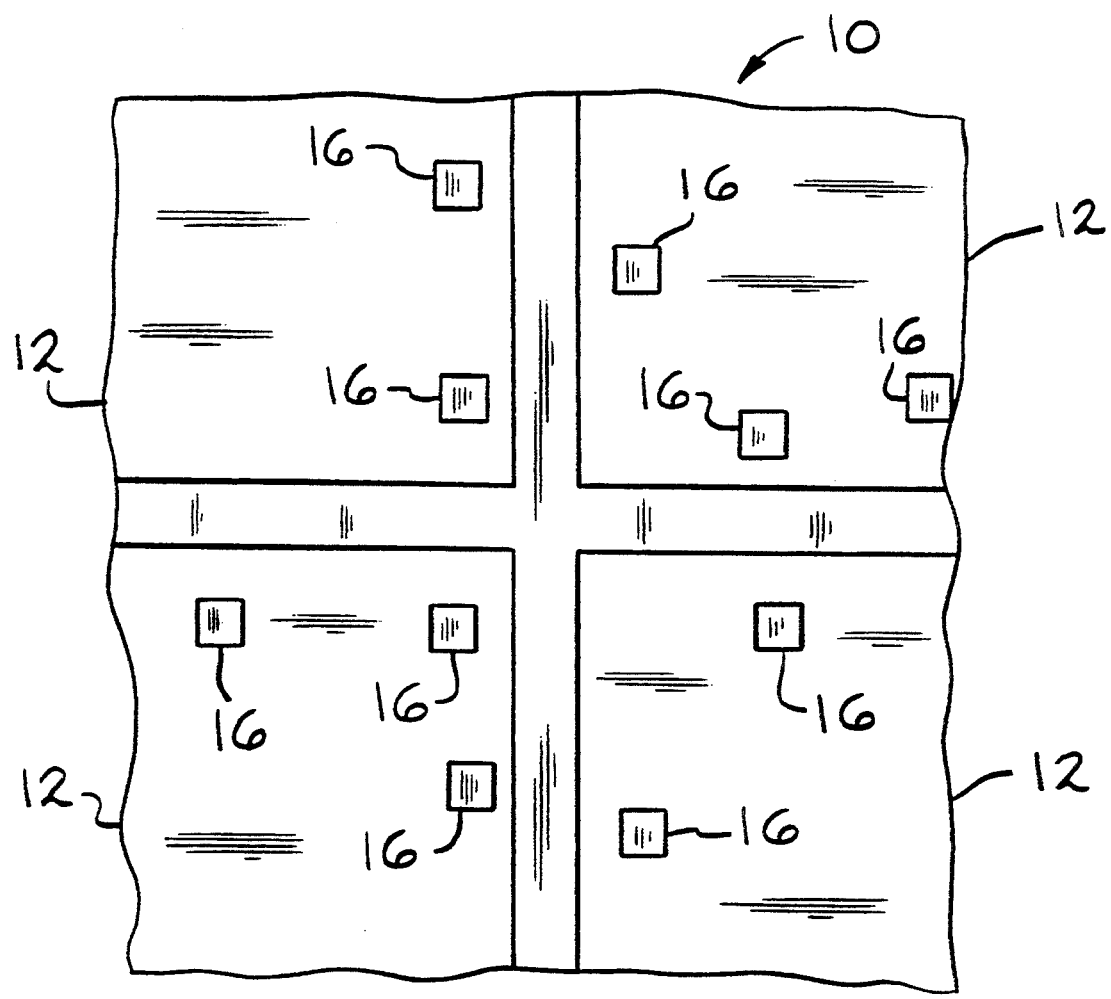
FIG. 6 is a top view showing a plurality of die on a wafer and a plurality of bonding pads on each die.

FIG. 3 shows CPDPL 22 covering the upper surface of wafer 10. CPDPL 22 is patterned to expose bond pad 16 with the exception of the periphery of pad 16.

Because of the risks of damage due to dust and other foreign matter, particles on a chip or touching by a technician is minimized by forming a polymer layer on the upper surface of the chip prior to wafer dicing. This polymer layer should have a thickness in the range from about 2 microns to about 10 microns in order to encapsulate any dust or other foreign matter particles and to protect the chip from subsequently encountered foreign particles or objects and from contact with a technician's hand.

This polymer layer may be formed by deposition on the chip of a solvent solution of a desired polymer materials. One polymer solution employed was acrylic resin in a xylene propanol solution called Laserscribe. Other materials include polyetherimides available from General Electric under the tradename Ultem ® 1000 and 6000 and various polymer materials such as Udel 1700 ® and 412 ® available from du Pont de Nemours and so forth. These materials are thermally stable and radiation hard. Other materials may also be used provided they exhibit sufficient thermal stability and radiation hardness for the intended application. Different solvents are appropriate to different ones of these materials. Two different types of materials are included in this list. Ultem 1000, Ultem 6000, Udel 1700 and XU 218 are thermoplastic materials. Materials like Giba Giegy 412 and Amoco AI-10 are thermoset materials.

A solvent solution of the selected polymer material is deposited on the upper surface of the semiconductor chip and dried to form the polymer dielectric layer. Another material is Ciba Giegy 412, which is a photosensitive thermoset, polyimide. The protective layer may be formed in a efficient manner by depositing the source solution on individual chips, which are stored in a chip tray with a dispensing pipette similar to that used to add materials to medical cultures.

This polymer materials may preferably be deposited in a liquid form comprised of 24.8% by weight of the liquid 412 solution provided by Ciba Giegy, 66.4% by weight N-mp (N-methypyrollodone), 0.59% by weight of a 0.1% solution of Fc420® available from 3M (a surfactant) and 8.3% by weight DMAC (dimethyl acetamide). The N-mp provides this solution to be deposited on the top surface of the semiconductor chip in a manner in which the deposited liquid stands up on the chip, and does not wet or extend around onto the edges of the chip. Consequently, a droplet 30 of this materials as much as about 20 mils thick may be deposited on the top of a chip. This material is then dried in a sequential thermal sequence of 10–20 minutes at 150° C., 10–20 minutes at 220° C. and 10–20 minutes at 300° C. This drying sequence removes the solvent from the droplets 30 and leaves a layer of the materials which appears to be fully crosslinked and acts as a thermoset materials in that it is no longer soluble in the solvent solution and does not soften except at extremely high temperatures. This material has a Tg of approximately 360° C. and remains fixed without flowing at substantially higher temperatures than that.

We then form the aluminum layer on top of the polymer layer. The aluminum layer is very thin, for example 150 to 250 angstroms. We found this confirmation to be very effective. For example, while we were successful in removing the aluminum layer after processing, the layer was not easily removed. Naturally, this resulted in extremely good protection of the chip.

In one embodiment of this invention, the aluminum layer is embedded in the polymer layer. By doing this, removal of the protective layers is much easier. When ease of removal is a consideration, we prefer the second embodiment of embedding the aluminum layer in the polymer layers. Accordingly, this invention provides an insulative polymeric layer covered by a conductive layer or a conductive polymeric layer. The aluminum connects all of the bond pads, thereby increasing the capacitance of the device far above the vulnerable femtofarad level. The aluminum layer, whether on the surface of the polymer or embedded in it connects the selected bond pads through the holes in the polymer layer.

The invention has been described in detail with particular reference to certain preferred embodiments thereof, but it will be understood that variations and modifications can be effected within the spirit and scope of the invention.

| PARTS LIST |
| --- |
| 10 semiconductor wafer |
| 12 semiconductor device |
| 14 device structure |
| 16 wire bond pad |
| 18 PDPL |
| 20 aluminum layer |
| 30 droplet |

What is claimed is:

1. A semiconductor device protected from electrostatic discharge comprising: a wafer including a plurality of semiconductor die wherein the die have wire bonding pads on a first surface thereof; a polymer dielectric layer disposed on and adhered to substantially all of the first surface of each die, excluding the wire bonding pads; and a thin aluminum layer adhered to the wire bonding pads wherein the aluminum layer also is embedded in the polymer layer.

2. A semiconductor device according to claim 1, wherein the aluminum embedded polymer layer only covers a portion of the wire bond pads.

3. A semiconductor device according to claim 1, wherein the wire bond pads have a periphery and a center portion and the aluminum embedded polymer layer covers the periphery, but not the center of the pads.

4. A semiconductor device protected from electrostatic discharge comprising: a wafer including a plurality of semiconductor die wherein the die have wire bonding pads on a first surface thereof; a polymer dielectric layer disposed on and adhered to substantially all of the first surface of each die, excluding the wire bonding pads; and a thin aluminum layer disposed on and adhered to both the polymer dielectric layer and the wire bonding pads, wherein, the aluminum layer has a thickness of 150 to 250 angstroms.

5. A semiconductor device according to claim 4, wherein the aluminum layer electrically connects the bond pads.

6. A semiconductor device according to claim 4, wherein the polymer layer has a thickness of 2 to 10 microns.

7. A semiconductor device according to claim 4, wherein the polymer dielectric layer is a photosensitive thermoset resin.

8. A semiconductor device according to claim 4, wherein the polymer layer is photosensitive thermoplastic resin.

9. A semiconductor device according to claim 4, wherein the polymer layer is an acrylic resin.

* * * * *